(12) United States Patent
Farooq et al.

(10) Patent No.: US 6,791,133 B2
(45) Date of Patent: Sep. 14, 2004

(54) INTERPOSER CAPACITOR BUILT ON SILICON WAFER AND JOINED TO A CERAMIC SUBSTRATE

(75) Inventors: Mukta Ghate Farooq, Hopewell Junction, NY (US); John U. Knickerbocker, Hopewell Junction, NY (US); Srinivasa Reddy, Lagrangeville, NY (US); Robert Anthony Rita, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/200,479

(22) Filed: Jul. 19, 2002

(65) Prior Publication Data

US 2004/0014313 A1 Jan. 22, 2004

(51) Int. Cl.⁷ .............................................. H01L 23/053
(52) U.S. Cl. ........................ 257/296; 536/691; 536/700
(58) Field of Search ................................ 257/296, 306, 257/415, 536, 691, 700, 712

(56) References Cited

U.S. PATENT DOCUMENTS

| | | | | |
|---|---|---|---|---|
| 4,322,778 A | * | 3/1982 | Barbour et al. ............. | 361/794 |
| 4,349,862 A | * | 9/1982 | Bajorek et al. ............. | 361/762 |
| 5,479,316 A | * | 12/1995 | Smrtic et al. ............... | 361/322 |
| 5,854,534 A | | 12/1998 | Beilin et al. | |
| 5,874,770 A | * | 2/1999 | Saia et al. .................. | 257/536 |
| 6,046,489 A | | 4/2000 | Yamaguchi | |
| 6,102,710 A | | 8/2000 | Beilin et al. | |
| 6,165,814 A | | 12/2000 | Wark et al. | |
| 6,388,207 B1 | * | 5/2002 | Figueroa et al. ............ | 174/262 |
| 6,407,929 B1 | * | 6/2002 | Hale et al. .................. | 361/763 |
| 2002/0170748 A1 | * | 11/2002 | Larson ........................ | 174/260 |

* cited by examiner

Primary Examiner—David Nelms
Assistant Examiner—Dao H. Nguyen
(74) Attorney, Agent, or Firm—James J. Cioffi, Esq.; McGinn & Gibb, PLLC

(57) ABSTRACT

An interposer, located between an integrated circuit having power, ground and signal connections and a ceramic substrate having power, ground and signal connections, that includes an oxide layer formed on a polished surface of a silicon substrate, a thin film dielectric capacitor formed on the oxide layer, a plurality of metallized that electrically connect to either of the electrodes of the thin film dielectric capacitor, and vias than conduct power, ground and signals between a the ceramic substrate and the integrated circuit. The interposer connects the metallized vias to the integrated circuit by solder connections and also connects the vias conducting power, ground and signals from the ceramic substrate to the interposer by solder connections. The dielectric of the thin film dielectric capacitor may be selected from the group of high-K titanates, such as, barium zirconate titanate, barium strontium titanate, pure barium titanate, barium titanate modified with Pb, Nb, W, Ca, Mg, and Zn, lead titanate, lead zirconate titanate, and polycrystalline lanthanum-modified lead zirconate titanate, or other high-K dielectrics, such as, lead niobate and its derivatives, and lead tungstate and its derivatives.

17 Claims, 3 Drawing Sheets

INTERPOSER CAPACITOR BUILT ON SILICON WAFER AND JOINED TO A CERAMIC SUBSTRATE

BACKGROUND OF THE INVENTION

1. Field of the Invention

The present invention generally relates to packaging of integrated circuit devices, and is particularly related to a thin film capacitor formed on a silicon/silicon oxide substrate interposer, which is connected to a ceramic substrate and to a method of making the same.

2. Description of the Related Art

As integrated circuit (IC) chips have increased in complexity and decreased in size, the formation of interconnections between IC chips has also greatly increased in complexity. Many devices, such as computers, use a number of separate IC chips. For example, a computer may include one or more central processing units, an arithmetic processor, various controller and memory chips, input/output interface chips, etc. Conventionally, each IC chip is mounted individually in a separate package that is connected to a printed circuit board, for example, a computer "motherboard," which provides power and signal interconnections to the mounted IC chips. However, when a device requires a large number of IC chips, individually packaging and mounting each IC chip greatly increases the printed circuit board area required to interconnect all the IC chips. Additionally, as device speed has increased, it has become more important to minimize the path lengths between IC chips, themselves, and the other electronic components connected to the IC chips.

To decrease printed circuit board space, distance between IC chips and the complexity of interconnections, many devices now use multichip modules (MCMs) that incorporate a number of IC chips into one package. Using one package reduces the distance between IC chips, thus, permitting greater device speeds. The multichip modules usually provide power and signal interconnections to the individual IC chips from an underlying ceramic substrate.

Multichip modules may be two-dimensional, that is, all the IC chips of a package are mounted on a planar substrate, or three-dimensional, where IC chips are mounted above or below a ceramic substrate, another IC chip, or an interposer. An interposer is a structure on which various electronic components and interconnections are formed and is usually located between an IC chip and a ceramic substrate, another interposer, or a printed circuit board.

As the switching speed of devices increases, it is important to provide a decoupling capacitance in close proximity to the IC chips of the multichip module. Conventionally, a discrete capacitor has been mounted on a surface of a ceramic substrate or a decoupling capacitance has been incorporated into the ceramic substrate. The former approach uses valuable real estate on the surface of the ceramic substrate and does not place the discrete capacitor in close proximity to the IC chip, while the latter approach increases the complexity of the ceramic substrate and thus, decreases yields.

SUMMARY OF THE INVENTION

In view of the foregoing and other problems and disadvantages of conventional methods, an object of the present invention is to provide an interposer having a silicon/silicon oxide substrate, on which is formed a high performance thin film dielectric capacitor that may connect an integrated circuit, e.g., IC chips or wafers, to a ceramic substrate.

Another object of the present invention is to provide a method of manufacturing an interposer having a silicon/silicon oxide substrate, on which is formed a high performance thin film dielectric capacitor, having good yield, relatively low cost and using standard IC fabrication processes.

A further object of the present invention is to provide an interposer having a silicon/silicon oxide substrate, on which is formed a thin film dielectric capacitor, to electrically decouple the signal interconnections from the power and ground interconnections, which connect to an integrated circuit.

In order to attain the above and other objects, according to an exemplary embodiment of the present invention, disclosed herein is an interposer, located between an integrated circuit having power, ground and signal connections and a ceramic substrate having power, ground and signal connections, that may include an oxide layer formed on a polished surface of a silicon substrate, a thin film dielectric capacitor formed on the oxide layer, metallized vias, each of which connects to either an upper or a lower electrode of the thin film capacitor, and vias that connect power, ground and signals between the ceramic substrate and the integrated circuit.

According to another exemplary embodiment of the present invention, the thin film capacitor may comprise platinum electrodes and a dielectric composed of high-K titanates, such as, barium zirconate titanate, barium strontium titanate, pure barium titanate, barium titanate modified with Pb, Nb, W, Ca, Mg and Zn, lead titanate, lead zirconate titanate, or polycrystalline lanthanum-modified lead zirconate titanate, or other high-K dielectric materials, such as, lead niobate and its derivatives, and lead tungstate and its derivatives.

According to another exemplary embodiment of the present invention, solder connections may connect the metallized vias of the interposer, connecting each of both electrodes of the thin film dielectric capacitor, to the integrated circuit and other vias of the interposer, conducting power, ground and signals, to the ceramic substrate.

According to another exemplary embodiment of the present invention, the interposer may be fabricated by chemical-mechanical polishing of a surface of a silicon substrate upon which is formed an oxide layer, thinning the oxidized silicon substrate by chemical-mechanical polishing of the non-polished surface of the silicon substrate, forming a thin film dielectric capacitor on the oxide layer, making vias that connect to either of the electrodes of the thin film capacitor and metallizing these vias, and forming vias that connect power, ground and signals between the ceramic substrate and the integrated circuit.

According to another exemplary embodiment of the present invention, making the vias that electrically connect to either of the electrodes of the thin film dielectric capacitor may utilize both chemical-mechanical polishing (CMP) and accurate endpoint detection.

According to another exemplary embodiment of the present invention, the dielectric of the thin film dielectric capacitor may be annealed at temperatures from about 350° C. to about 1000° C.

According to another exemplary embodiment of the present invention, the patterning of the thin film dielectric capacitor to form at least one capacitor may be accomplished by forming a stencil and ion milling the electrodes and the dielectric layer of the thin film dielectric capacitor.

According to another exemplary embodiment of the invention, a system using a decoupling capacitance may include a ceramic substrate having power, ground and signal connections, an integrated circuit having power, ground and signal connections, and an interposer having a thin film dielectric capacitor that is electrically coupled to the integrated circuit and vias that conduct power, ground and signals between the ceramic substrate and the integrated circuit.

Thus, the present invention overcomes the problems of the conventional methods and structures by using a high performance thin film dielectric capacitor, having low parasitic and low inductance capacitance, formed on an interposer that may be positioned between an IC chip and a ceramic substrate. One side of the interposer, on which is formed the thin film dielectric capacitor, may be connected to the ceramic substrate by vias that transfer power, ground and signals. On the other side of the interposer, an IC chip may be attached to vias connected to the thin film capacitor electrodes. In this manner, the thin film dielectric capacitor may be located in close proximity to the IC chip to provide improved decoupling to the IC chip.

The interposer may be manufactured separately and tested before incorporation into the multichip module. This is particularly important because the thin film dielectric capacitor may be one of the most likely components to be defective, due to the close spacing of the plate electrodes and the possibility of pin-hole defects or surface irregularities causing electrical shorts or leakage in the dielectric layer between the plate electrodes.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Referring to FIGS. 1–7, the device and method of the present invention for various exemplary embodiments is described below.

Generally, the present invention takes advantage of fabricating a thin film dielectric capacitor on a silicon/silicon oxide substrate interposer having an extremely high quality surface. The interposer may include through vias that transfer power, ground and signals from, for example, an underlying ceramic substrate to an overlying IC chip or wafer, vias that connect electrodes of the thin film dielectric capacitor to the IC chip or wafer, and interconnections among the through vias transferring power and ground to the vias connecting the electrodes of the thin film capacitor. One side of the interposer may connect to the IC chip, while the other side of the interposer may connect to the ceramic substrate. In this manner, surface defects of the ceramic substrate will not impact yields of the thin film dielectric capacitor.

Figure 1:
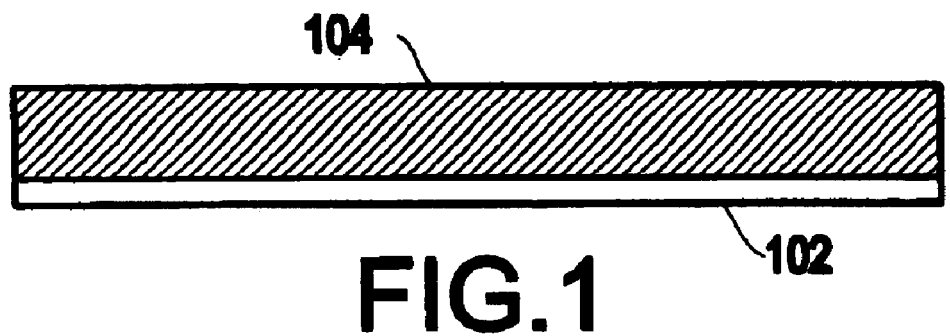
FIG. 1 illustrates an oxidized silicon substrate 104 in an exemplary embodiment of the present invention.

Referring to FIG. 1, an oxide layer 102 of approximately 5000 Å may be formed on a silicon substrate 104, for example, a silicon wafer, the bottom surface of which may have a substantially planar surface having, for example, a surface irregularity of less than about 500 Å peak-to-peak, that may be obtained by, for example, chemical-mechanical polishing (CMP). Oxidation of the substantially planar surface of the silicon substrate 104, thus, results in an extremely high quality planar surface of the oxide layer 102. In various exemplary embodiments, the oxide layer 102 is formed by a thermal process, various chemical vapor deposition (CVD) processes, or other processes well known in the art. Experimental results indicate that oxide layers having a thickness exceeding 5000 Å result in unnecessary processing, while a thickness of less than approximately 1000 Å is sometimes found inadequate to ensure proper insulation and to prevent degrading reactions.

Figure 2:
FIG. 2 illustrates the oxidized silicon substrate 204 having been substantially reduced in thickness in an exemplary embodiment of the present invention.

Referring to FIG. 2, the oxidized silicon substrate 204 is substantially reduced in thickness by, for example, CMP polishing of the non-polished surface. Thicknesses in the range of about 50 $\mu$m to about 300 $\mu$m are preferred for the polished oxidized silicon substrate because this range of thicknesses allows for the highest density of vias to be prepared in the silicon/silicon oxide layers, although in various exemplary embodiments, a thickness as great as approximately 1000 $\mu$m may be used.

Figure 3A:
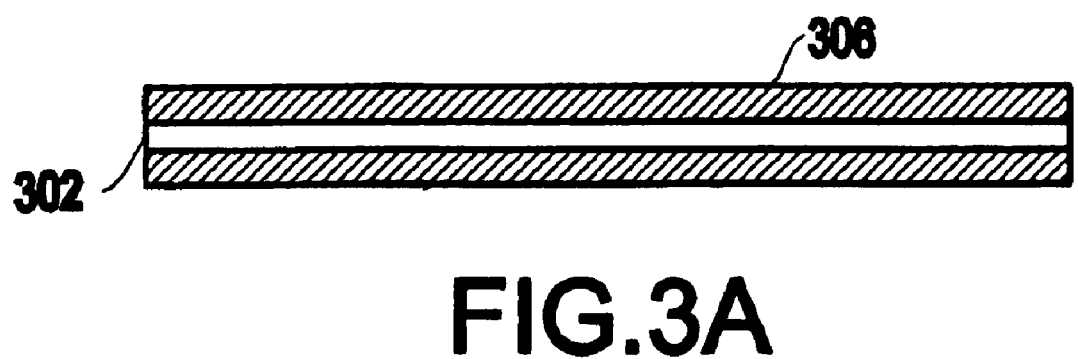
FIG. 3A illustrates a thin film dielectric capacitor 306 formed on the oxide layer 302 of the oxidized silicon substrate in an exemplary embodiment of the present invention.

Referring to FIG. 3A, a thin film dielectric capacitor 306 is fabricated on the oxide layer 302 of the oxidized silicon substrate, preferably using a high-K dielectric to achieve a maximal capacitance value. Although derivatives of barium titanate, such as barium zirconate titanate (BZT) and barium strontium titanate (BST) are preferred materials for the dielectric, other materials, such as, for example, pure barium titanate, barium titanate modified with Pb, Nb, W, Ca, Mg, Zn and other components familiar to those in the art, and other high-K titanates, such as lead titanate and its derivatives, such as lead zirconate titanate (PZT) and poly crystalline lanthanum-modified lead zirconate titanate (PLZT), and lead niobate and lead tungstate may be used in various exemplary embodiments of the present invention.

A capacitor dielectric thickness of as small a value as possible is preferred because a greater capacitance value will result. In various exemplary embodiments having electrode areas of about 10 mM$^2$ to about 500 or more mm$^2$, experimental results indicate that a dielectric thickness of at least approximately 500 Å decreases shorting defects and attains adequate yields, and a thickness range of dielectric material of about 1000 Å to about 3000 Å is preferred. Dielectric layers of greater than approximately 3000 Å thickness unfavorably reduce the capacitance of the thin film dielectric capacitor 306.

In various exemplary embodiments, the foregoing dielectric materials are usually annealed in air at temperatures from about 350° C. to about 1000° C., with a preferred annealing cycle being 1 hour in air at a temperature of 650° C.

In various exemplary embodiments, patterning of the layers of the thin film dielectric capacitor formed on the substrate allows the formation of one or more thin film dielectric capacitors and controls the disposition of the thin film dielectric capacitors. Patterning of the dielectric layer, for example, a high-K titanate layer, may be accomplished by the preferred method of ion milling through a resist stencil, after deposition of the high-K dielectric material by, for example, sputtering, and subsequent annealing of the high-K dielectric material. However, in various exemplary embodiments, patterning of the high-K dielectric layer may also be accomplished by other processes, for example, reactive ion etching (RIE) or chemical etching, well known in the art.

Because platinum does not oxidize during thermal treatment, such as the annealing process for high-K dielectric materials outlined above, platinum is the preferred material to form the thin film dielectric capacitor electrodes usually applied under and usually over the high-K dielectric layer. Platinum also has the advantages of tending to promote a preferred orientation of the dielectric material suitable for the formation of capacitors and does not adversely react with the dielectric material during processing.

In various exemplary embodiments, lower and upper platinum electrodes of the thin film dielectric capacitor may be deposited on the oxide layer 302 of the oxidized silicon substrate and a dielectric layer of the thin film dielectric capacitor 306, respectively, by various deposition processes, for example, sputtering and evaporation, well known in the art. However, as is also well known in the art, alternative materials may be substituted for platinum, for example, gold, palladium and silver or alloys of platinum, gold, palladium and silver, in the formation of one or both of the thin film dielectric capacitor electrodes in various exemplary embodiments of the present invention.

In various exemplary embodiments, platinum electrodes, each having a thickness usually in the range of about 100 Å to about 5000 Å may be formed with a range of about 500 Å to about 1500 Å being preferred.

In various exemplary embodiments, the thin film dielectric capacitor electrode materials, for example, platinum, may be patterned by creating a resist stencil and, for example, dry etching with chemicals, wet etching with chemicals, or ion milling.

Experimental results for forming a thin film dielectric capacitor by the processes outlined above, demonstrate fairly high yields of about 80%. In contrast, using a thin film process for thicknesses in a range of a few thousand Å combined with processing temperatures in excess of 650° C. to build a thin film dielectric capacitor on an unmodified ceramic substrate is extremely difficult, producing near zero yields. These near zero yields, resulting from electrical shorts and other defects, are caused by the ceramic surface defects, such as, holes, pits, projections and other forms of roughness of the surface topography of an unmodified ceramic substrate, which are sufficiently large to prevent a continuous, sufficiently smooth, and defect-free thin film dielectric capacitor from being built. Experimental results indicate that standard lapping and polishing techniques are inadequate to produce a ceramic surface with the quality needed to reduce surface defects so that a thin film dielectric capacitor with sufficiently high yield may be built on an unmodified ceramic substrate surface.

Referring to FIG. 3A, a passivation layer (not shown) of materials, such as, silicon nitride, silicon oxide and other materials well known in the art, may be formed on the topmost surface of the interposer to cover the thin film dielectric capacitor 306 after patterning. In various exemplary embodiments, the passivation layer is formed by, for example, CVD or other processes well known in the art.

Figure 3B:
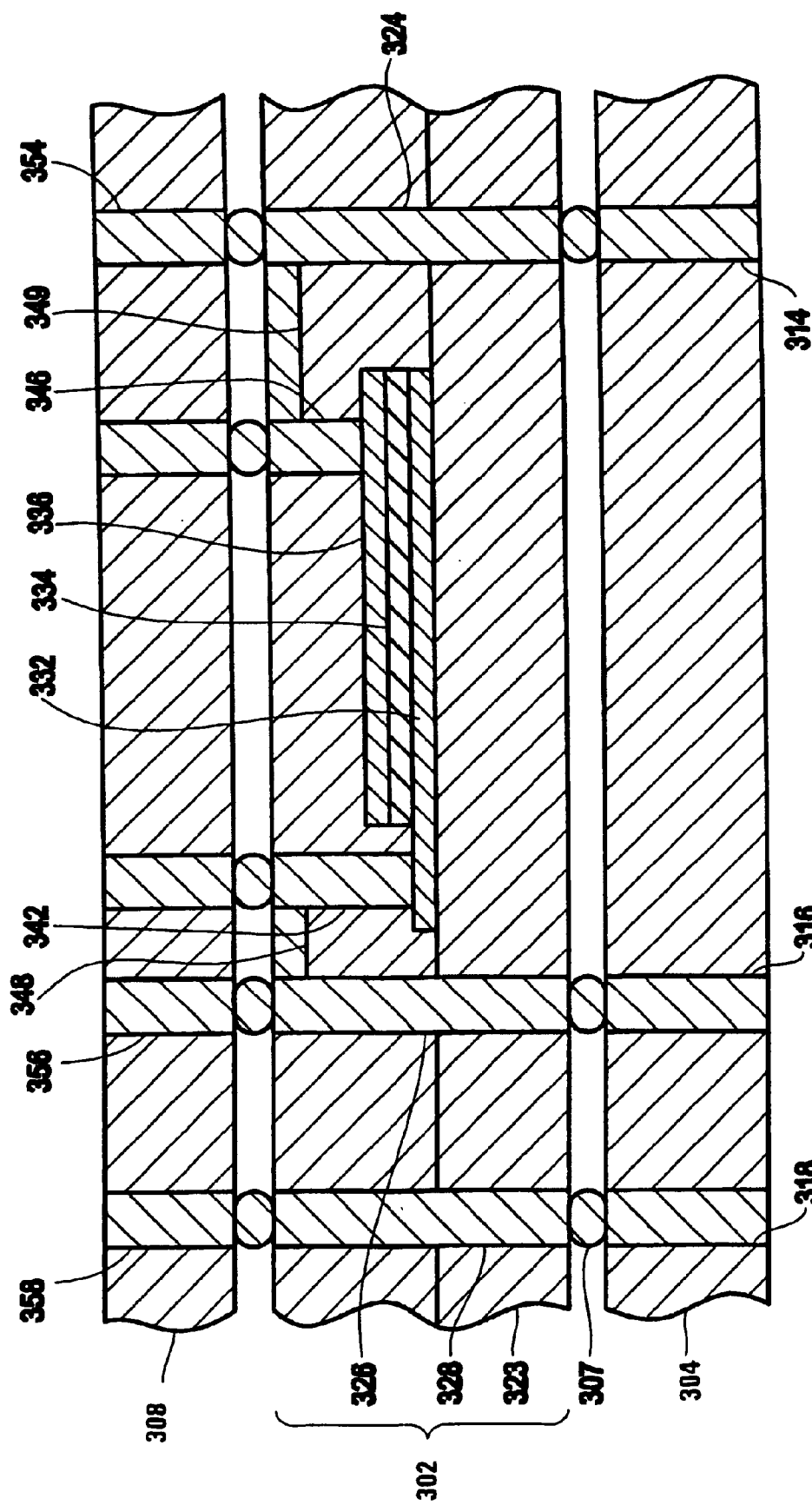
FIG. 3B illustrates a schematic diagram of the ceramic substrate 304, interposer 302 with interconnected vias, integrated circuit 308, and controlled collapse chip connections 307 in an exemplary embodiment of the invention

FIG. 3B is a detailed illustration of an exemplary embodiment of FIG. 3A comprising an interposer capacitor. Referring to FIG. 3B, a patterned thin film dielectric capacitor, including a lower electrode 332, a dielectric 334 and an upper electrode 336, may be formed on a silicon/silicon oxide layer 323 of the interposer 302. In various exemplary embodiments, through vias 324, 326, and 328 may be formed, which transfer, for example, power, ground and signals, respectively, between, a corresponding power connection 314, ground connection 316 and signal connection 318 of an underlying ceramic substrate 304 to a corresponding power connection 354, ground connection 356 and signal connection 358 of an overlying integrated circuit 308. The through vias 324, 326 and 328 may be connected to the underlying ceramic substrate 304 and the overlying integrated circuit 308 by, for example, controlled collapse chip connections (C4) 307.

Figure 4:
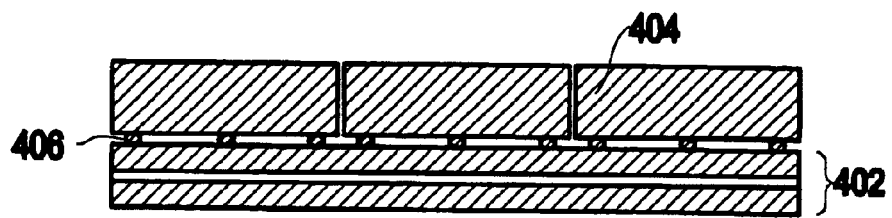
FIG. 4 illustrates the ceramic substrate 404 connected to the interposer 404 in an exemplary embodiment of the present invention.

Referring to FIG. 4, the upper side of the interposer 402, that is, the side having the passivation layer, may be connected to, for example, a ceramic substrate 404 with an appropriate solder. In various exemplary embodiments, PbSn solders may be used by controlled chip connections (C4) 406 to connect the vias of the interposer 504 to the ceramic substrate 404 but other suitable solder compositions and soldering processes well known in the art may also be used.

Figure 5:
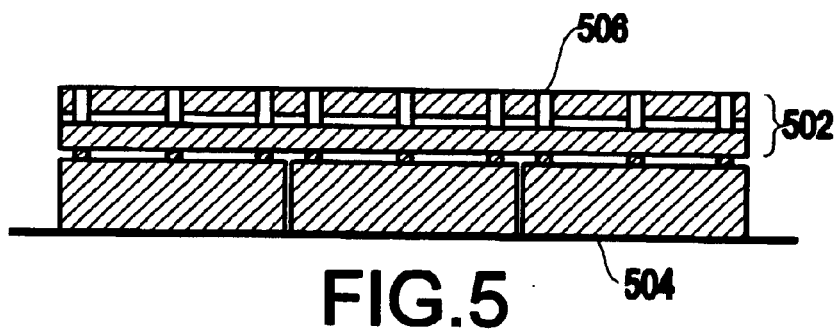
FIG. 5 illustrates the ceramic substrate 504 and connected interposer 502 flipped, to form vias 506 connecting to the thin film dielectric capacitor in an exemplary embodiment of the present invention.

Referring to FIG. 5, the interposer 502 and connected ceramic substrate 504 may be flipped, so that the ceramic substrate 504 forms the underlying substrate to the interposer 502. In various exemplary embodiments, vias 506 may be formed in the interposer 502, using CMP with accurate endpoint detection, as described in U.S. Pat. Nos. 4,793,895 and 5,308,438 and 5,337,015, which are commonly assigned to International Business Machines Corporation, incorporated herein by reference, and reactive ion etching (RIE), that connect to the plate electrodes of the patterned thin film dielectric capacitor (not shown) for power and ground. Similarly, additional vias (not shown) may be formed in the interposer 502 for signal vias that do not connect to the thin film dielectric capacitor in regions of the interposer designated for signal transmission.

Figure 6:
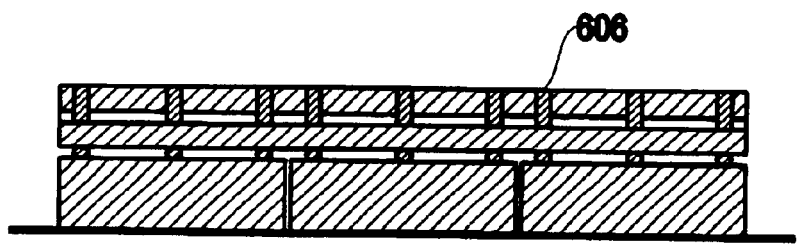
FIG. 6 illustrates metallized vias 606 connecting the thin film dielectric capacitor in an exemplary embodiment of the present invention.

Referring to FIG. 6, the vias connected to the patterned thin film dielectric capacitor may be metallized by standard thick film processes, plating, screening metal paste, or other suitable techniques in various exemplary embodiments of the present invention to form metallized vias 606.

Figure 7:
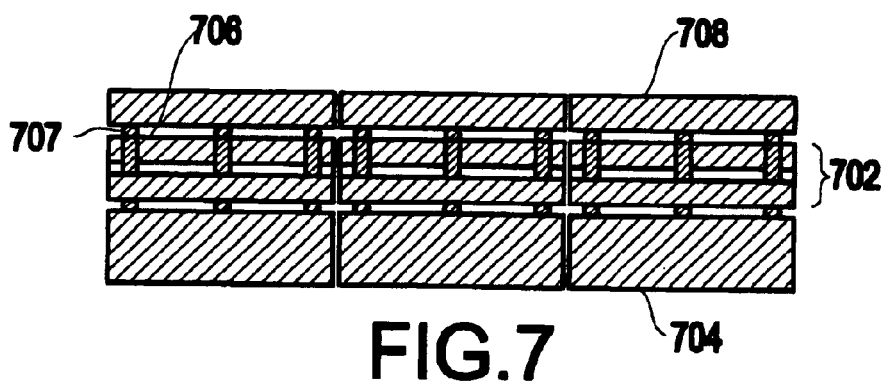
FIG. 7 illustrates the interposer 702 connected to an integrated circuit 708 by controlled collapse chip connections 707 in an exemplary embodiment of the present invention.

Referring to FIG. 7, the interposer 702 may be connected to an integrated circuit 708, e.g., an IC chip or wafer, by C4 connections 707, which connect the metallized vias 706 connected to the patterned thin film dielectric capacitor, to the integrated circuit 708.

In various exemplary embodiments, a hierarchy of solders, having different melting points, may be used to connect, for example, one side of the interposer 702 connecting a ceramic substrate 704 and the other side of the interposer 702 connecting an integrated circuit chip 708.

After connecting the interposer 702 to the integrated circuit 708 and the ceramic substrate 704, testing and burn-in may be readily accomplished. The testing interface may be facilitated by the thin film dielectric capacitor being directly connected to the C4 interconnections 707. Such capacitor testing may, for example, facilitate sorting of the capacitors for speed, which is an important as operating frequencies exceed, for example, 300 MHz.

The present invention may allow a high performance thin film dielectric capacitor to be placed in close proximity to IC chip and to a ceramic substrate from which power, ground and signals may be obtained in order to provide improved decoupling capacitance to the IC chip. The formation of a thin film dielectric capacitor on a multilayer ceramic interposer may allow separate manufacture with good yield, relatively low cost and standard IC fabrication techniques and may permit separate testing before incorporation into a multichip module.

While the invention has been described in terms of exemplary embodiments, those skilled in the art will recognize that the invention can be practiced with modification within the spirit and scope of the appended claims.

What is claimed is:

1. An interposer located between an integrated circuit having power, ground and signal connections and a ceramic substrate having power, ground and signal connections, the interposer comprising:
   an oxide layer formed on a substantially planar surface of a silicon substrate;
   a thin film dielectric capacitor, having a first electrode, a dielectric, and a second electrode, formed on the oxide layer;
   a plurality of metallized vias including a first metallized via in electrical contact with the first electrode and a second metallized via in electrical contact with the second electrode, the plurality of metallized vias extending from the first electrode and the second electrode to a surface of the interposer, the surface being adjacent to the integrated circuit; and
   a plurality of vias including a first via that conducts power between the ceramic substrate and the integrated circuit, a second via that conducts ground between the ceramic substrate and the integrated circuit, and a third via that conducts signals between the ceramic substrate and the integrated circuit.

2. The interposer of claim 1, wherein the substantially planar surface is defined as less than about 500 Å peak-to-peak of surface irregularity.

3. The interposer of claim 1, further comprising:
   a first plurality of solder connections, a first of the first plurality of solder connections electrically connecting the first metallized via in electrical contact with the first electrode and a second of the first plurality of solder connections electrically connecting the second metallized via in electrical contact with the second electrode the integrated circuit.

4. The interpose of claim 3, further comprising:
   a second plurality of solder connections including a first connection for electrically connecting the first via that conducts power, a second connection for electrically connecting the second via that conducts ground, and a third connection for electrically connecting the third via that conducts signals, to the ceramic substrate.

5. The interposer of claim 1, wherein the dielectric comprises one of barium zirconate titanate, barium strontium titanate, pure barium titanate, barium titanate modified with Pb, Nb, W, Ca, Mg, and Zn, lead titanate, lead zirconate titanate (PZT), and polycrystalline lanthanum-modified lead zirconate titanate (PLZT).

6. The interposer of claim 1, wherein the dielectric comprises one of lead niobate, lead niobate derivatives, lead tungstate and lead tungstate derivatives.

7. The multilayer ceramic interposer of claim 1, wherein the oxide layer is about 1000 Å to about 5000 Å in thickness.

8. The interposer of claim 1, wherein a layer thickness of the dielectric is about 500 Å to about 3000 Å and each of the first electrode and the second electrode has a thickness of about 100 Å to about 5000 Å.

9. The interposer of claim 1, wherein the first electrode and the second electrode comprise one of platinum, gold, palladium, and silver, and alloys of platinum, gold, palladium, and silver.

10. The interposer of claim 1, wherein at least one of the plurality of metallized vias is electrically connected to at least one of the first via and the second via.

11. A multichip module that includes a decoupling capacitance, comprising:
    a ceramic substrate including a power connection, a ground connection, and a signal connection;
    an integrated circuit including a power connection a ground connection, and a signal connection,
    a multilayer ceramic interposer comprising a thin film dielectric capacitor, which is formed on a substantially planar oxidized silicon surface;
    a first plurality of vias in electrical contact with a first electrode and a second electrode of the thin film dielectric capacitor, the first plurality of vias extending from the first electrode and the second electrode to a surface of the multilayer ceramic interposer, the surface being adjacent to the integrated circuit; and
    a second plurality of vias comprising:
      a power via that conducts power between the power connection of the ceramic substrate and the power connection of the integrated circuit,
      a ground via that conducts ground between the ground connection of the ceramic substrate and the ground connection of the integrated circuit, and
      a signal via that conducts signals between the signal connection of the ceramic substrate and the signal connection of the integrated circuit.

12. An interposer comprising:
    an oxide layer formed on a substantially planar surface of a silicon substrate;
    a thin film dielectric capacitor, having a first electrode, a dielectric, and a second electrode, formed on the oxide layer;
    a plurality of metallized visa including a first metallized via in electrical contact with the first electrode and a second metallized via in electrical contact with the second electrode, the plurality of metallized visa extending from the first electrode and the second electrode to a surface of the interposer, the surface being adjacent to an integrated circuit,
      wherein the dielectric comprises one of barium zirconate titanate, barium strontium titanate, pure barium titanate, barium titanate modified with Pb, Nb, W, Ca, Mg, and Zn, lead titanate, lead zirconate titanate (PZT), polycrystalline lanthanum-modified lead zirconate titanate (PLZT), lead niobate, lead niobate derivatives, lead tungstate and lead tungstate derivatives.

13. The interposer of claim 12, further comprising:
    a plurality of visa including a first via that conducts power between a ceramic substrate and the integrated circuit, a second via that conducts ground between the ceramic substrate and the integrated circuit, and a third via that conducts signals between the ceramic substrate and the integrated circuit.

14. The interposer of claim 12, wherein the substantially planar surface is defined as less than about 500 Å peak-to-peak surface irregularity.

15. An interposer comprising:

an oxide layer formed on a substantially planar surface of a silicon substrate;

a thin film dielectric capacitor, having a first electrode, a dielectric, and a second electrode, formed on the oxide layer:

a plurality of metallized visa including a first metallized via in electrical contact with the first electrode and a second metallized via in electrical contact with the second electrode, the plurality of metallized visa extending from the first electrode and the second electrode to a surface of the interposer, the surface being adjacent to an integrated circuit; and a plurality of vias including:
at least one of a first via that conducts power between a ceramic substrate and the integrated circuit and a second via that conducts ground between the ceramic substrate and the integrated circuit; and
a third via that conducts signals between the ceramic substrate and the integrated circuit.

16. The interposer of claim 15, wherein the dielectric comprises one of barium zirconate titanate, barium strontium titanate, pure barium titanate, barium titanate modified with Pb, Nb, W, Ca, Mg, and Zn, lead titanate, lead zirconate titanate (PZT), polycrystalline lanthanum-modified lead zirconate titanate (PLZT), lead niobate, lead niobate derivatives, lead tungstate and lead tungstate derivatives.

17. The interposer of claim 15, wherein the substantially planar surface is defined as less than about 500 Å peak-to-peak of surface irregularity.

* * * * *